(12) United States Patent
Campeau

(10) Patent No.: US 10,964,874 B2
(45) Date of Patent: Mar. 30, 2021

(54) THERMOELECTRIC GENERATOR USING IN-SITU PASSIVE COOLING

(71) Applicant: Gerard R Campeau, Newmarket (CA)

(72) Inventor: Gerard R Campeau, Newmarket (CA)

( * ) Notice: Subject to any disclaimer, the term of this patent is extended or adjusted under 35 U.S.C. 154(b) by 0 days.

(21) Appl. No.: 16/501,457

(22) Filed: Feb. 20, 2018

(65) Prior Publication Data
US 2020/0185587 A1 Jun. 11, 2020

(51) Int. Cl.
*H01L 35/32* (2006.01)
*H01M 10/44* (2006.01)

(52) U.S. Cl.
CPC .......... *H01L 35/32* (2013.01); *H01M 10/443* (2013.01)

(58) Field of Classification Search
CPC ....... H01L 35/32; H01L 35/30; F28D 21/001; F28D 7/00; F28D 9/00; F28D 1/00; F28D 1/06; F28D 2020/0065; F28D 1/0308; F28D 9/0031; F28D 9/0037; F28D 1/0358; F28D 9/0012; F28D 9/0025; F28D 9/0081; F28F 3/005; F28F 3/08; F28F 1/00; F28F 1/42; B60H 2001/2275; F01N 5/025; F24F 5/0442; F23M 2900/13003; F02G 5/02; F02G 2260/00; F02G 2262/00

USPC .............. 136/205, 210, 209, 212, 208, 207; 165/164, 172, 179, 132, 165, 166
See application file for complete search history.

(56) References Cited

U.S. PATENT DOCUMENTS

| | | | | |
|---|---|---|---|---|
| 5,901,572 A | * | 5/1999 | Peiffer | B60H 1/32014 62/480 |
| 9,797,652 B1 | * | 10/2017 | Wilkerson | B67D 1/0862 |
| 9,844,300 B2 | * | 12/2017 | Cedar | F23L 5/02 |
| 2004/0134932 A1 | * | 7/2004 | Lobdell | B67D 3/0009 222/146.5 |
| 2006/0150637 A1 | * | 7/2006 | Wauters | B67D 1/0869 62/3.64 |
| 2009/0151342 A1 | * | 6/2009 | Major | F02G 5/02 60/320 |
| 2013/0340802 A1 | * | 12/2013 | Jovovic | H01L 35/30 136/201 |
| 2015/0243870 A1 | * | 8/2015 | Kushch | F24B 1/26 136/211 |

\* cited by examiner

*Primary Examiner* — Justin M Jonaitis

(57) ABSTRACT

A portable electrical power generation system using thermoelectric modules to produce voltage from a temperature differential. The temperature differential is maintained using a passive cooling system including a retained liquid coolant and heat from a heated fluid.

8 Claims, 14 Drawing Sheets

THERMOELECTRIC GENERATOR USING IN-SITU PASSIVE COOLING

FEDERALLY SPONSORED RESEARCH

Not applicable

SEQUENCE LISTING OR PROGRAM

Not applicable

FIELD OF THE INVENTION

The present invention relates to portable and permanent generators of electrical energy and more specifically to generators using solid state Seebeck Effect thermoelectric (TEG) modules and various thermodynamic arrangements including passive cooling methods to maintain suitable module operation.

BACKGROUND OF THE INVENTION

Modern Seebeck Effect thermoelectric modules transform a temperature difference across the module, between the hot and cold sides of the device, into a usable voltage. While the temperature difference is maintained, the module can provide a continuous power source. A module in these conditions is considered an on-demand electrical energy generation system.

Passive Liquid Cooling:

The prior art describes thermoelectric generation systems using passive liquid cooling. For example U.S. Pat. No. 8,674,530 B2 describes a cooking pot filled with a phase change material (e.g. water) as a heat exchanger using passive liquid cooling. However, this format does not maintain a stable cold side surface temperature. The coolant boils and rapidly evaporates. Without sufficient liquid there is insufficient cooling and the thermoelectric module fails due to excessive heat concentration on the hot side of the module. Moreover, the hot side is in contact with the heat source through a relatively thin aluminum interface. In this configuration, the temperature of the hot side is easily pushed beyond the recommended temperature and will be damaged. This configuration produces poor temperature differential because the side walls of the vessel containing the coolant are fully within the heat envelope of the combustion source and this raises the coolant temperature. Thus, the temperature difference across the TEG device is reduced and the available power is reduced.

Providing a Heat Source Using Combustion of Biomass:

The prior art discloses other attempts to use thermoelectric modules for power generation. In particular, U.S. Pat. No. 8,851,062 B2 describes a system with a heat source based on the combustion of biomass and provides a fan to generate air flow to both convectively cool the module's cold side and to improve fuel combustion. However, the fan is powered by an internal battery which must be initially charged before it can be used to facilitate the heating and cooling of the module. Moreover, if the internal battery is discharged below the threshold to operate the fan, the system's heating and cooling fails, the power from the thermoelectric module fails, and the thermoelectric module can be exposed to excessive temperature.

The primary requirement for continuous energy generation using thermoelectric modules is maintaining a sustained temperature difference across the module. In other words, keeping the hot side hot, and the cold side cold. This requires a constant source of heat and a method for cooling the cold side. It is also desirable to reduce the variation in the temperature difference so that there is little deviation (less than 10%) in the power output over time. The present invention provides these needed characteristics in a novel and non-obvious thermoelectric generator that uses a passive cooling strategy.

SUMMARY

In part, this disclosure relates to methods and systems for a thermoelectric generator system. The system is designed and constructed to generate usable voltage using thermoelectric modules each having a designated hot and cold side, a heat absorber thermally connecting to the hot side of each module to a heat source, and a heat exchanger vessel, thermally connecting the cold side of each module to a liquid coolant retained by the vessel. In one aspect, the heat absorber and heat exchanger vessel are constructed with at least one planar surface to improve the thermal connection with the hot side and cold side of thermoelectric module, respectively.

In another aspect, the heat exchanger vessel and heat absorber are constructed from extruded aluminum forms having integral fins whose dimensions and spacing are conducive to the efficient absorption and transfer of heat. In this embodiment, the heat absorber fins are directly immersed in a fluid heat source. The absorber fins conduct heat to the hot side of the modules. Moreover, the heat exchanger vessel is extruded with both external and internal fins such that the internal fins are immersed in the retained liquid coolant and provide an efficient heat sink for the cool side. Thus, using these components a sufficient temperature difference is maintained across the modules and a corresponding stable voltage is provided.

In another aspect, a plurality of heat exchanger vessels of similar configuration are provided. In this case, the combined retained liquid volume is at least 10 liters of the liquid coolant. The combined liquid volume provides larger heat capacity and greater heat dissipation. In addition, at least a second heat absorber is provided to conduct heat from a common heat source such as the exhaust flue stream of a wood fired heating stove, a natural gas fireplace appliance, or other biomass combustion site. This embodiment can be further scaled with more vessels, larger liquid volumes, and more heat absorbers.

In another aspect, an external Direct Current (D.C.) fan powered by the present thermoelectric generator system provides convective air flow directed to the exterior fins of a heat exchanger vessel. This configuration improves the flow of heat from the external fins particularly in conditions of elevated ambient temperature and humidity.

Other embodiments are within the scope of the present invention. Different combustion fuels can be used as the heat source such as alcohol based fuels suitable for indoor use.

Although the present disclosure relates to different aspects and embodiments, it is understood that the different aspects and embodiments disclosed can be integrated, combined, or used together as a combination system, or in part, as separate components, devices, and systems, as appropriate.

BRIEF DESCRIPTION OF THE FIGURES

The figures are to be considered illustrative in all aspects and are not intended to limit the disclosure. The figures are not necessarily to scale.

DETAILED DESCRIPTION

Figure 1:
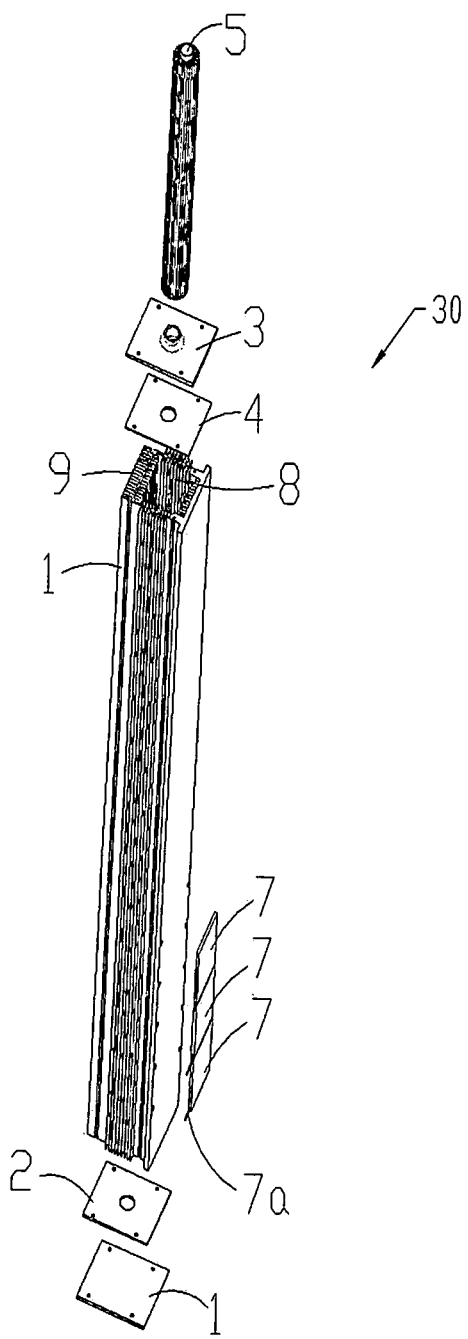
FIG. 1 is an isometric view of a preferred embodiment of a heat exchanger vessel.

It should be understood that the present invention is not limited in its application to the details of construction and the arrangement of components set forth in the following description or illustrated in the drawings. The invention is capable of other embodiments and of being practiced or of being carried out in various ways. Also, it is to be understood that the terminology used herein is for the purpose of description and should not be regarded as limiting. The use of "includes", "including", "comprising," or "having" and variations is meant to encompass the items listed and their equivalents. Unless otherwise limited, the terms "connected," "coupled", "configured" and "mounted" and variations are used broadly and encompass direct and indirect connections, couplings and mountings. In addition, the terms "connected" and "coupled" and variations may include thermal, mechanical, and electrical connections. Furthermore, and as described in subsequent paragraphs, the specific mechanical and/or other configurations illustrated in the drawings are intended to exemplify embodiments of the invention. However, other alternative mechanical and/or electrical and other configurations are possible which are considered to be within the teachings of the disclosure. It will be understood that the dimensions suggested in the description of the figures are for illustration only and are not limited to those presented in this disclosure.

FIG. 1 shows an embodiment of a heat exchanger vessel assembly 30 accommodating a plurality of thermoelectric modules 7, comprising a vessel 1 having a first end and a second end, and capable of retaining a liquid, water being a typical liquid although a glycol based coolant can be substituted if the potential exists for the water to freeze if ambient conditions exist. The vessel has at least one planar surface suitable for efficient thermal mounting of thermoelectric modules. The cold side of each of the plurality of thermoelectric modules 7, are coupled to the outer planar surface of the vessel 1. The planar surface of the vessel may be finished and prepared to improve the thermodynamic efficiency of the coupling. For example, the surface may be polished and/or a thermal conductive paste may be added between the module surface and vessel. These are efficiency improvements known to the art. Electrical connections 7a are provided from the plurality of thermoelectric modules 7. The heat exchanger vessel is formed by extrusion of aluminum into a vertically oriented rectangular vessel of such dimensions and height to retain at least 1.5 liters of coolant in one embodiment with a corresponding height of at least 381 mm. There is a cover plate 3 for the first end which, among other uses, is intended to reduce the rate of evaporation of the coolant in conjunction with an upper silicon rubber based sealing gasket 4. The second end is joined to an aluminum plate 6 which serves to retain the liquid coolant, and includes a lower silicon rubber based sealing gasket 2 capable of operating up to 500 degrees Celsius without deformation of the gasket. Condenser tube 5 is coupled to cover plate 3.

In the embodiment of FIG. 1, the condenser tube 5 is fabricated by extrusion of aluminum with a plurality of densely spaced fins at least 2 millimeters in width and at least 10 millimeters in height at a minimum distance of 2 millimeters between adjacent fins, and forming a circular object with an internal diameter of at least 10 millimeters. The exterior surface of the condenser tube is exposed to the ambient environment. In a manner known to the art, under suitable ambient conditions, heat from vaporized coolant is dissipated from the interior of the condenser tube and into the environment. As the vapor releases heat it condenses to its liquid phase and eventually returns to the liquid coolant in the vessel 1. There is a vent plug on top of the condenser tube which prevents over-pressure in the vessel and condenser tube system. The condenser tube 5, cover plate 3, and upper sealing gasket 4 are optional when used in portable or non-permanent applications.

The heat exchanger vessel 1 is fabricated such that the internal surfaces and the external surfaces other than the planar surface have fins. The fins are longitudinally oriented with their long dimension parallel to the long dimension of the vessel. In this embodiment, the longitudinally oriented fins of the vessel are also vertically oriented. The internal fins 8 are extruded such that they protrude from the interior wall of the vessel and are immersed in the liquid coolant. Heat is efficiently conducted from the internal fins 8 to the external fins 9. The external fins transfer the heat to the ambient air through convection. To increase the rate of heat transfer from the external fins 9 to the ambient air, a system may be installed to force convection, for example an external fan. This will improve heat transfer even with higher than ideal ambient temperature or humidity.

In addition, the vertical orientation of the vessel and the fins is intended to take advantage of thermal gradients that develop in the vessel as absorbs heat substantially from the bottom. In general, the more buoyant heated liquid moves upward while cooler liquid returns downward by gravity. An internal liquid flow loop is created. The flow of liquid past the internal fins improves the rate of heat transport from the internal liquid to the exterior fins. Thus, the system operates as a passive cooling system without the need for an externally powered liquid pump.

Figure 2:
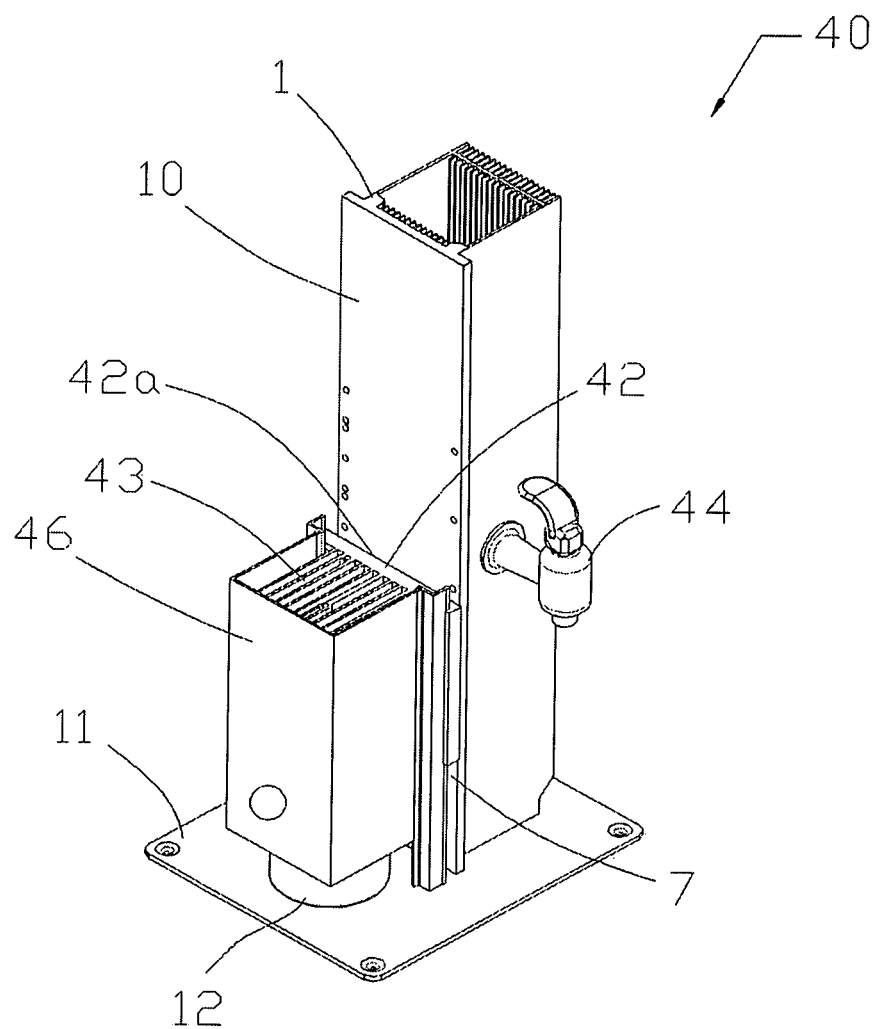
FIG. 2 is an isometric view of a preferred embodiment of a portable, on-demand thermoelectric power generator.

FIG. 2 shows one embodiment of a portable thermoelectric power generator 40 in accordance with the teachings of the present invention. The system includes a vessel 1 that functions as a heat exchanger, and retains a liquid coolant, for example water. A heat injection system provides a suitable heat source to the thermoelectric modules 7. The heat injection system includes a heat absorber 42, a heat source 12, and a heat shield 46. The heat absorber 42 is comprised of an aluminum heat sink extrusion with heat absorber fins 43 that are large relative to the outer dimensions of the heat source container. The heat absorber fins 43 are positioned to efficiently collect and conduct heat from the heat source to the hot side of thermoelectric modules. The heat absorber 42 has a planar surface 42a thermally connected to the modules 7.

In this embodiment, the heat is provided by an open flame from heat source 12 wherein the flame is produced by burning a hydrocarbon based fuel derivative chosen from a list of fuels including gel based alcohol, ethanol, methanol or the like. In addition, heat shield 46 is an aluminum sheet shaped to provide at least two functions. 1) The heat shield surrounds and protects the heat sink fins and heat source. For example, it prevents external ambient air and wind from adversely affecting heat source and it protects the fuel source and fins in the event the system is tipped over. 2) The heat shield shape and orientation act to direct heat and hot gases from the combusting heat source vertically through the absorber fins 43 improving heat collection by the fins. The heat shield 46 can be raised or lowered vertically. The heat shield is raised to allow the fuel source to be placed directly below the heat absorber 42 and to ignite the fuel source initially. The heat shield 46 is lowered when the fuel is ignited.

In addition, a tap 44 is provided on the side of the vessel 1. If the temperature of the cooling liquid, and hence the cool side of the modules becomes higher than is appropriate for suitable power generation, the tap allows the heated liquid to be conveniently removed from the vessel. In order to prevent damage to the thermoelectric modules 7 resulting from excessive temperature on the hot side, the tap 44 is positioned on the side of the vessel just above the physical location of the thermoelectric modules 7. This allows approximately 50% of the liquid to be replaced with cool liquid while providing suitable cooling with the remaining liquid. The remaining liquid reduces the risk of damage to the thermoelectric modules during liquid exchange.

In this embodiment, the thermoelectric power generator is mounted to and supported by, a plate 11. This plate has a plurality of through holes that can be used to mount the generator to yet another surface.

Figure 3:
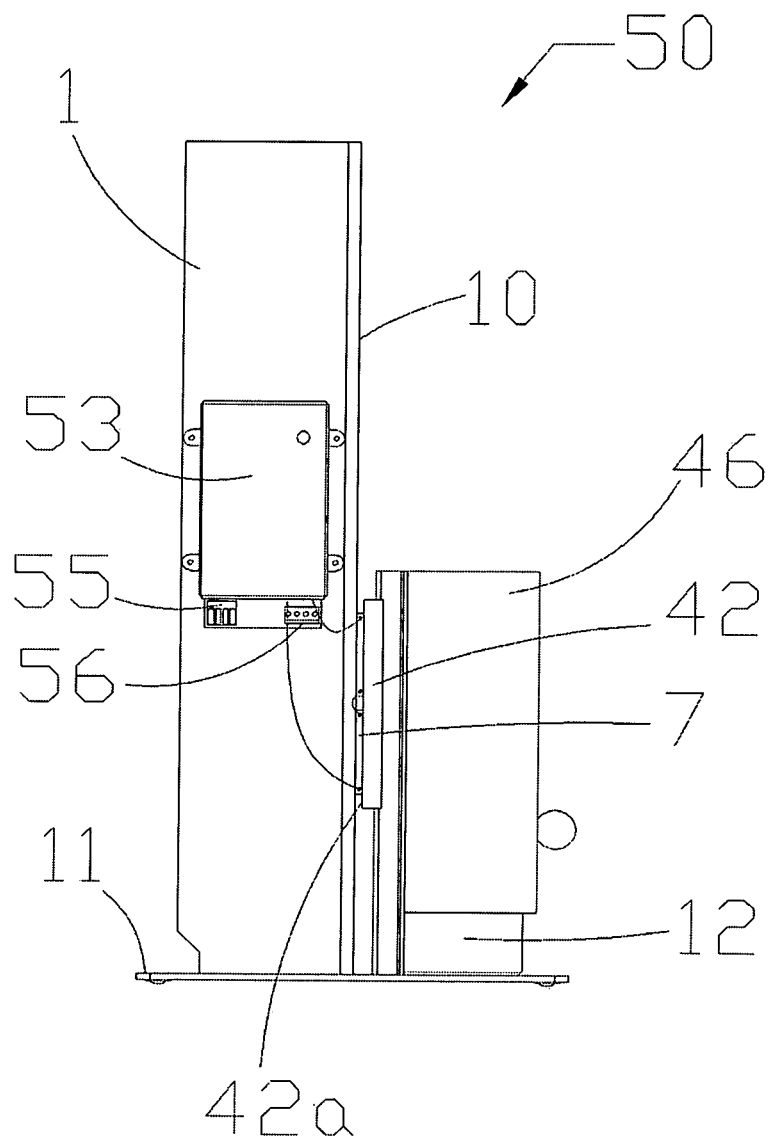
FIG. 3 is a side elevation view of a preferred embodiment of a portable, on-demand thermoelectric power generator.

FIG. 3 is a side elevation view revealing the electrical interconnection of the electronics control assembly 53 and the thermoelectric modules 7. The thermoelectric modules 7 are mounted directly between the heat absorber 42 and the heat exchanger vessel 1, with the hot side of the thermoelectric modules 7 thermally connected with the planar surface 42a of heat absorber 42 and the cold side of the thermoelectric modules 7 connected in direct contact with the heat exchanger vessel 1 via planar surface 10. Within the electronics control assembly, there is a D.C. voltage regulator, and a D.C. to D.C. voltage converter, to condition the resulting output voltage and current generated by the thermoelectric modules. The output power is available to a variety of external devices.

For example, the power is available to charge cellular handset batteries, which typically provide an attachment mechanism for communications and battery charging consisting of a Universal Serial Bus (USB) connector 55. Other cellular telephone manufacturers will use a proprietary connection scheme for charging their battery, the Apple Lightning connector being another such format. By using a suitable USB to Lightning adapter device, it is possible to charge Apple iPhone devices and iPad devices. Typical USB connectors will accept charging voltages of 5 Volts D.C., to allow the internal charge controller of the cellular handset to charge the internal battery. There is provided an electronic interface circuit board mounted on the exterior surface of the heat exchanger that facilitates the connection of the conditioned D.C. output voltage to the external cellular handset. The USB connector 55 is a preferred cellular battery charging format due to the availability of 5 Volts D.C. from the USB A connector, thus there is provided on the interface circuit board for this device, a USB A connector 55 providing 5 Volts D.C. for the purpose of charging the cellular telephone battery. There is also provided, an additional current-limited output voltage output 56 that allows the direct connection of a rechargeable battery or a Light Emitting Diode (LED) light source. The external battery that can be recharged with this connection can vary from 1.2 Volts to 12 Volts, including 3.6 Volts, 5 Volts, 6 Volts, 7.2 Volts and 9 Volts. The charging current for any battery is fixed at a maximum of 125 milliamps. LED light sources are commonly available that are used at 12 Volts thereby supporting the charging of a cellular handset and the use of an LED lamp simultaneously.

Figure 4:
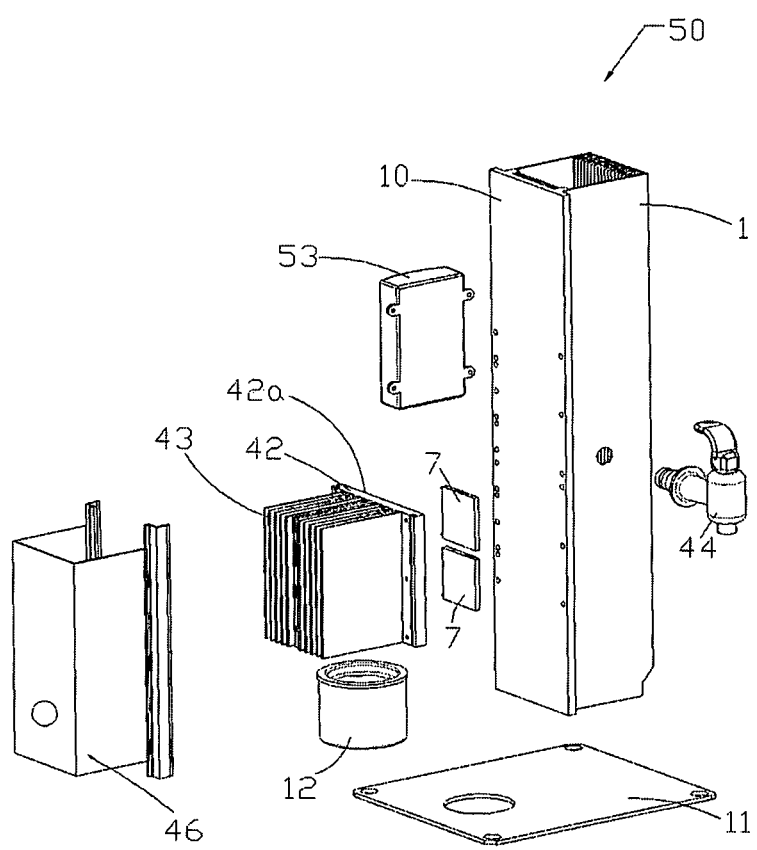
FIG. 4 is an isometric exploded view of a preferred embodiment of a portable, on-demand thermoelectric power generator.

FIG. 4 is an exploded view of a thermoelectric generator system. In particular, the relative positions of the heat absorber 42, heat source 12, and heat shield 46 are shown.

Figure 5:
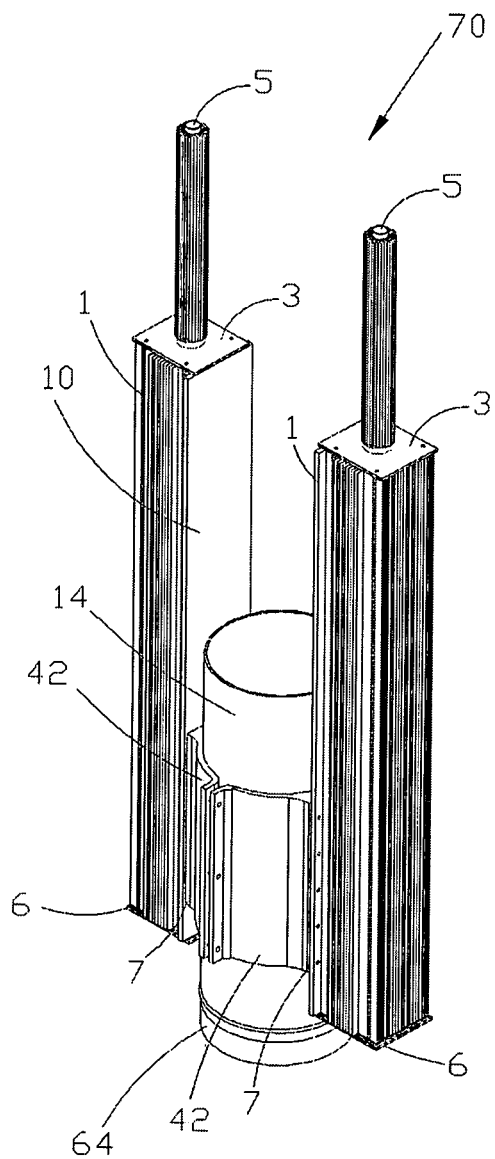
FIG. 5 is a simplified isometric view of a preferred embodiment of a permanently installed, on-demand thermoelectric power generator using the flue stream of a combustion site.

The thermoelectric generator system in FIG. 1 is versatile and can be combined in arrangements with a plurality of such generators 70 to exploit larger heat sources as shown in FIG. 5. The embodiment illustrated in FIG. 5 is an isometric view of a configuration suitable for use with the heat provided by the exhaust from a chimney or flue 64 connected to a combustion site (not shown) which is the heat source. In this case, the exhaust stream in flue 64 is substantially equivalent to the heat source 12 of FIG. 3 and can be produced by burning any of a variety of biomass choices. Two heat exchanger vessels 1 are positioned adjacent to flue 64. Each heat exchanger vessel is coupled to a heat absorber 42 having integral heat absorber fins protruding through suitable apertures in the flue 64 such that the heated exhaust passes over the fins as it flows through the flue duct. In this way, heat from the exhaust stream is absorbed by heat absorbers 42 and conducted to the hot side of thermoelectric modules 7. The cold side of thermoelectric modules 7, are suitably connected to the heat exchanger vessels 1. The arrangement in FIG. 5 may also include electrical control assemblies and liquid exchange taps if suitable for the installation. In addition, the arrangement is not limited to two heat exchanger systems. Flues with larger circumference can accommodate a larger number of heat exchanger systems.

Figure 6:
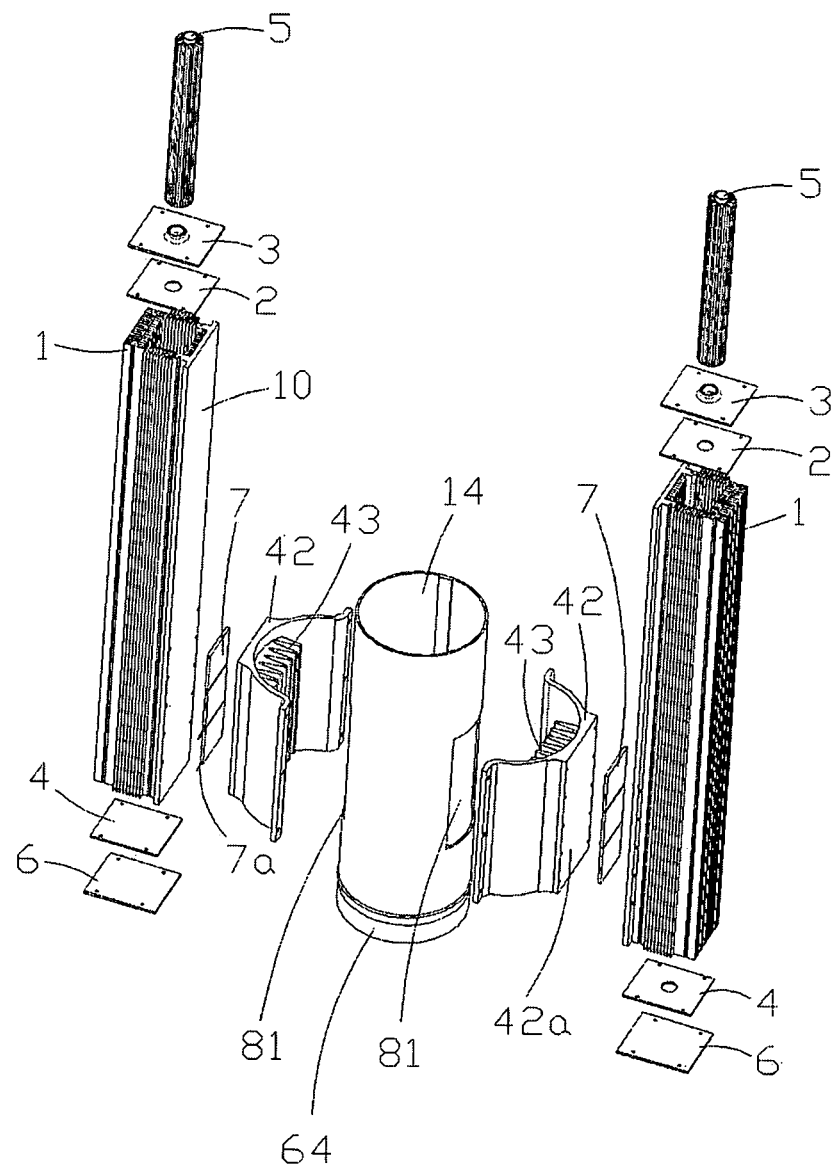
FIG. 6 is a simplified isometric exploded view of a preferred embodiment of a permanently installed, on-demand thermoelectric power generator using the flue stream of a combustion site.

FIG. 6 is an isometric exploded view of the embodiment in FIG. 5. showing the internal configuration and assembly of this embodiment. In particular, the apertures 81 in the flue and protruding absorber fins 43 and planar surface 42a of heat absorbers 42 are visible. Other components common to the system of FIG. 1 are also shown.

Figure 7:
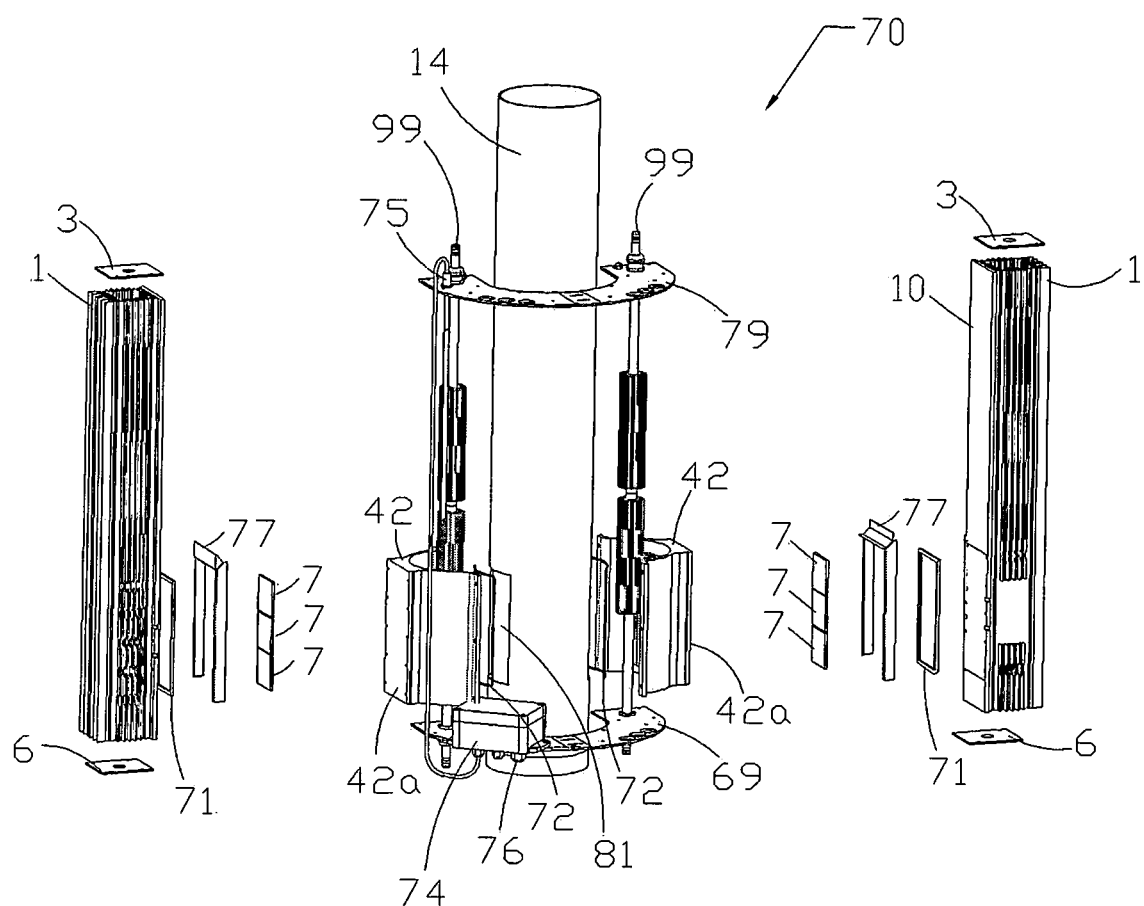
FIG. 7 is an isometric view of a preferred embodiment of a permanently installed, on-demand thermoelectric power generator using the flue stream of a combustion site, including an auxiliary heat exchange tube for active, low pressure secondary cooling, for use in high ambient temperature conditions with reduced convective air flow.

The embodiment in FIG. 7 shows a modification of the system in FIG. 6. In this case, the thermoelectric power generator assembly 70 is intended for a permanent outdoor installation. Several unique features and configurations are added in this embodiment. Heat exchanger mounting brackets 69 and 79 are provided to secure and support the thermoelectric generator assembly to a location along the flue 14 suitable to extract heat from the exhaust flow. There are two heat absorbers 42 mounted to absorb heat from the flue. As in FIG. 6, absorber fins 43 (not shown) are immersed in the exhaust heat stream via opposing apertures 81 to extract heat and conduct it to the hot side of each thermoelectric module 7. Two silicon heat absorber mating gaskets 72, prevent any fluid leaks from inside the flue to ambient. The cold side of each module 7 is connected to a heat exchanger vessel 1.

In this embodiment, the thermoelectric modules 7 are protected from environmental exposure with the combination of silicon sealing gaskets 71 and a simple module cover 77 that can be fabricated with steel or aluminum, steel being a more robust choice, with standard metal-forming techniques that are well understood in the art. In addition, each heat exchanger vessel 1 is fitted with an upper silicon sealing gasket 3, and a lower silicon sealing gasket 6 which serve to prevent coolant leaks during normal operation. Vent plugs 73 maintain ambient pressure inside the heat exchanger vessels.

A sensor assembly 75 measures the level and temperature of liquid coolant in each vessel 1. The sensor assembly 75 provides an output signal to interface 74 that is proportional to the level of the coolant remaining in the vessel 1. For example, a capacitive level sensor is known to the art and can be used in this embodiment. Furthermore, sensor assembly 75 measures the temperature of the coolant using for example, a thermistor device, which is also conditioned by the electronic interface 74 to provide an output that is proportional to the temperature of the liquid coolant. The method by which the electronic interface 74 is configured to provide the desired proportional liquid level and temperature output states will be readily apparent to anyone skilled in the art of electronics interfacing. All electrical connections to and from the electronic interface 74, are made by using one of three dedicated water resistant cable glands 76.

A finned heat exchanger tube 78 is used in a closed loop tube-in-tube heat exchanger configuration. In this case, the heat exchanger tube 78 is mounted inside heat exchanger vessel 1 to assist in maintaining a stable temperature differential across the hot and cold side of the thermoelectric modules 7. There is provided, a pipe gland 99 on the top and bottom ends of heat exchange tube 78 for attachment to external fluid tubing and a reservoir for cooling.

Figure 8:
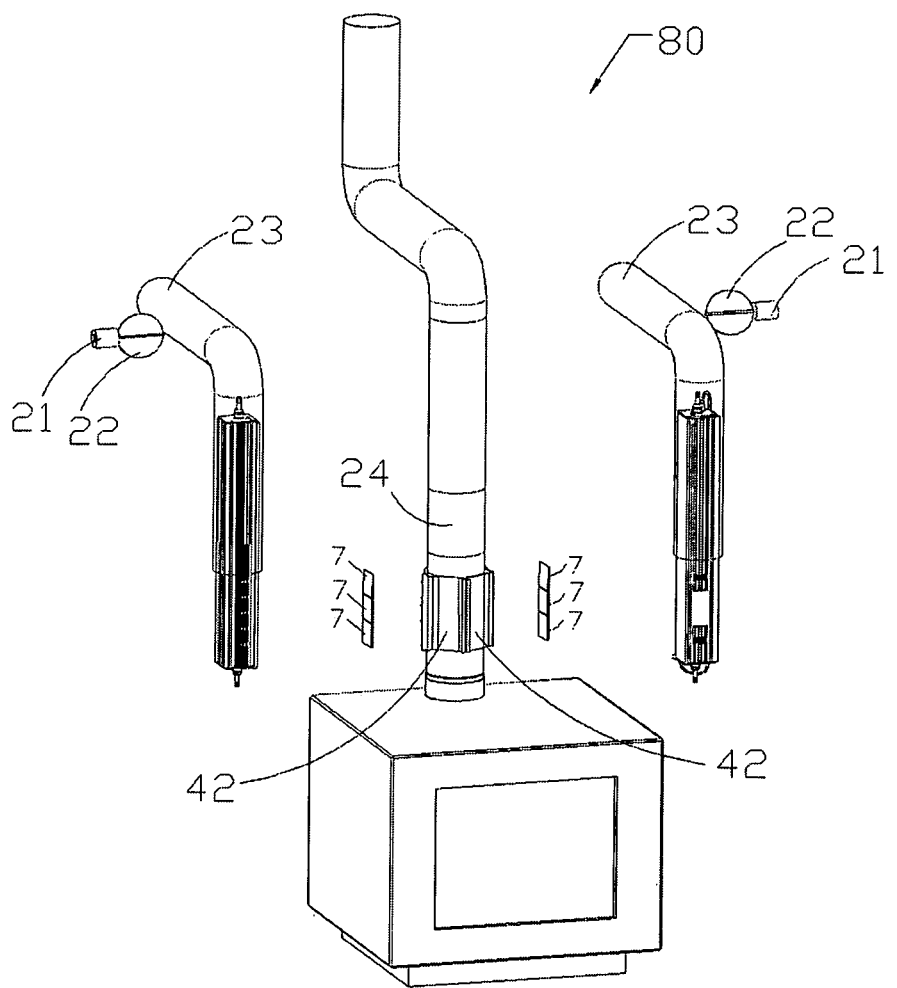
FIG. 8 is an isometric exploded view of a preferred embodiment of a permanently installed, on-demand thermoelectric power generator using the flue stream of a combustion site, a for use in high ambient temperature conditions with reduced convective air flow.

FIG. 8 is an exploded view of an embodiment 80, using thermoelectric generator systems arranged to produce voltage from the heated exhaust of a wood burning stove 20 or other hearth device. This arrangement absorbs heat from the exhaust using heat absorbers 42 and conducts the heat to the hot side of modules 7. The cold side of modules 7 is maintained by the heat exchanger vessels 1. Uniquely, the two heat exchanger vessels 1 are mounted in the cold air return pipes 23 of the stove 20. Cold air return pipes 23 with an inside diameter of at least 102 mm are designed to fit over each heat exchanger vessel 1 to allow cool air to flow past external fins 9 of each heat exchanger vessel 1. This convective cooling improves the removal of heat from the cold side of modules 7. A servo mechanism consisting of damper 22, a stepper motor 21, and temperature feedback measurement sensor 82 is operably configured to control the position of the damper 22 in response to the measured temperature. For example, when the coolant temperature increases above a desired set-point, stepper motor 21 is commanded to rotate the damper 22 to allow more return air flow and thereby increase the convective cooling of the heat exchanger 1. The electronic control system responsible for implementing the temperature responsive damper can be fabricated using either analog or digital servo loop techniques, and will be readily appreciated by those practitioners skilled in the art.

In addition, this embodiment includes a manually operated telescoping flue insert 24. The insert can be used to expose the absorber fins of the heat absorber 42 inside the exhaust flue 14 to allow the fins to be cleaned on a periodic basis. It is well known that wood burning stoves are prone to the accumulation of creosote buildup inside the flue.

Figure 9:
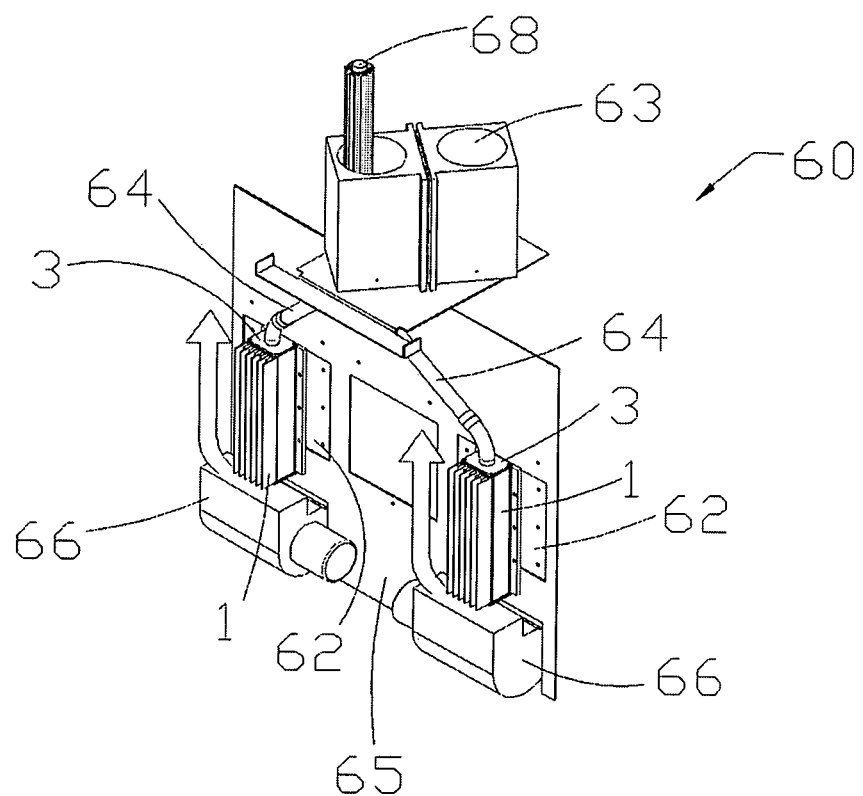
FIG. 9 is an isometric view of a preferred embodiment of a permanently installed, on-demand thermoelectric power generator using the combustion site of a natural gas fireplace appliance.

FIG. 9 is an isometric view of an embodiment 60 using two heat exchanger vessel assemblies 30 of FIG. 1, two heat absorber plates 62, and heat sourced from a combustion site of a hearth device such as a natural gas fireplace appliance 65. Two heat absorber plates 62 are attached to the steel rear side of the fireplace 65 conduct heat to the hot side of thermoelectric modules (not visible in this view) and two heat exchanger vessels 1 are positioned to dissipate heat from the cold side of each module. In addition, as part of a typical gas fireplace installation, there are two 12 Volt D.C. blower fan motors 66 that are primarily intended to direct the heat from the inside of the fireplace through a vent near the top of the enclosure to warm the external air in the area where the fireplace is installed. In this embodiment, the fan motors are oriented to also allow cool air to flow past external fins 9 (indicated by the bold arrows), of the heat exchanger vessel 1. When the voltage produced by the thermoelectric modules 7 is sufficient to cause fan motors 66 to operate, the additional secondary cooling provided by the forced air will cause the temperature differential across the thermoelectric modules 7 to increase and result in a higher voltage which allows greater load currents to be accommodated. This electrical energy can be used to provide power for external lighting, battery charging and cell phone charging as may be desired by the user of the appliance during power outages or interruptions. Each heat exchanger 1 shares a common condenser tube 68 through a common condenser coupling tube 64 arranged in a Y configuration.

Figure 10:
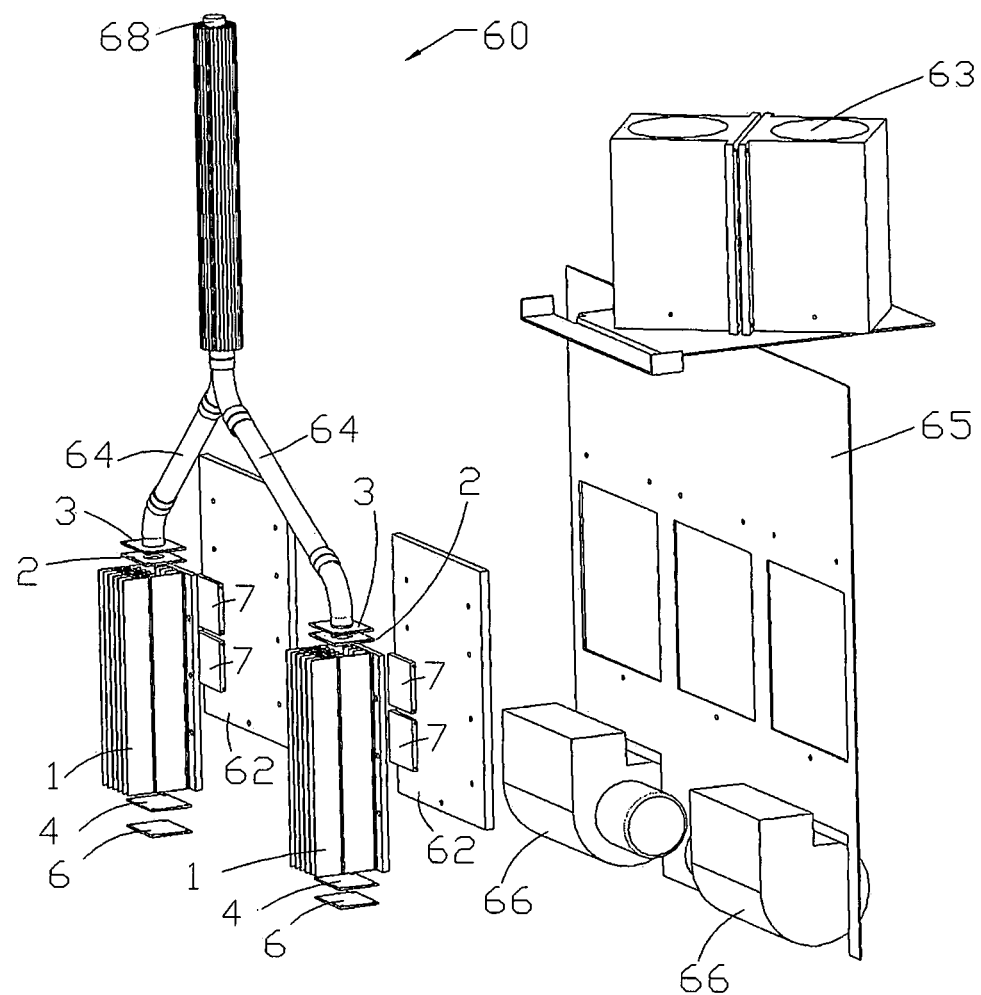
FIG. 10 is an isometric exploded view of a preferred embodiment of a permanently installed, on-demand thermoelectric power generator using the combustion site of a natural gas fireplace appliance.

FIG. 10 is an exploded view of the embodiment 60 of FIG. 9. This embodiment uses the heated air and combustion products from a heat source such as a natural gas fireplace appliance. A cold air intake port 63 for the fireplace appliance allows additional cooling air flowing past the condenser tube 68.

Figure 11:
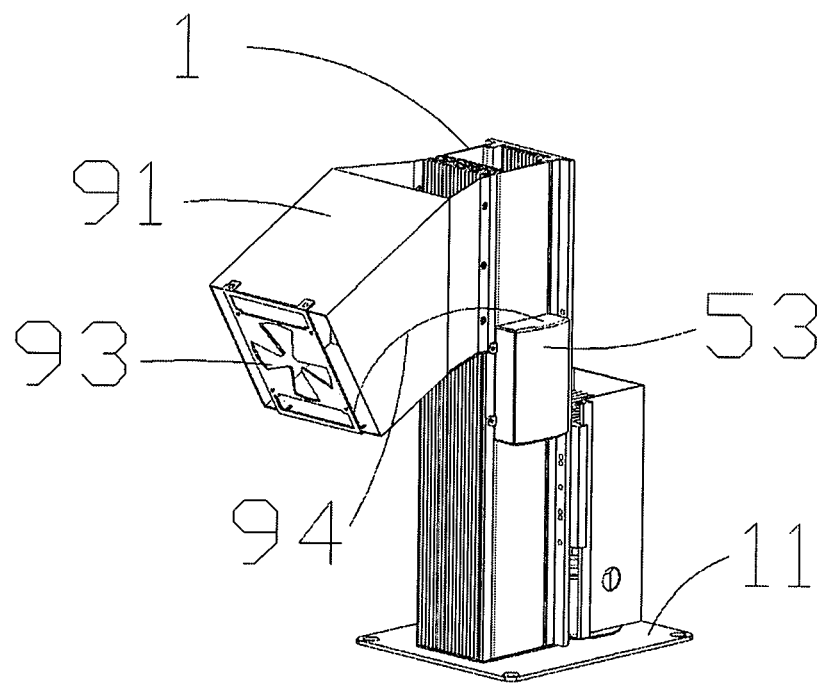
FIG. 11 is an isometric view of a preferred embodiment of a convective air flow multiplier utilizing air entrainment for a thermoelectric power generator.
Figure 12:
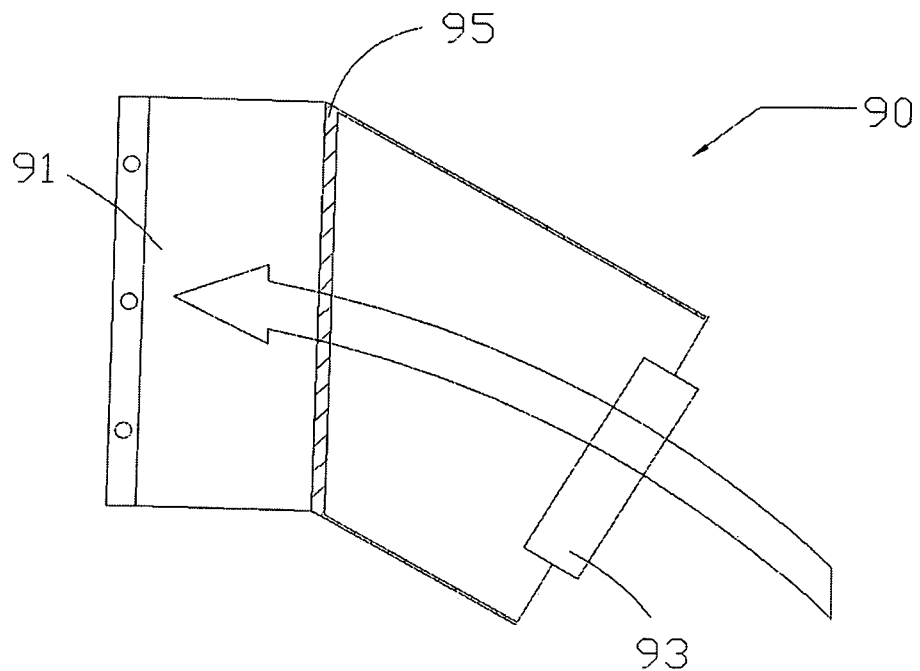
FIG. 12 is a section view of a preferred embodiment of a convective air flow multiplier utilizing air entrainment for a thermoelectric power generator.

FIG. 11 shows an isometric perspective view of a preferred embodiment of a heat exchanger, including the duct and fan assembly 90 of FIG. 12, attached to the heat exchanger vessel 1. This assembly improves the convective air flow on the exterior fins of the tower to remove the heat from the exterior fins to ambient. In a preferred embodiment there is provided a D.C. fan motor 93, a trapezoidal shaped enclosure 91 to contain and direct the air flow from the fan, and a metallic fine pitch mesh assembly 95, shown in FIG.

12 that will entrap insects such as mosquitoes. The enclosure is fabricated from a suitable material for the operating environment and may be a plastic or metallic material that is open on both ends to allow air to flow through it. The D.C. fan motor 93 is mounted on one entry port end, and is oriented in such a way that airflow from the fan will be directed through the blades of the fan from outside the enclosure, to the inside of the enclosure. The dimensions of the enclosure 91 containing the fan should be greater than the dimensions of the fan. The fan is powered by an electrical connection 94 from electronics module 53.

Additionally, the location of the entry port of the enclosure 91 is oriented such that the flow of air is towards the heat source 12. In one embodiment, heat source 12 includes burning biomass and thus produces $CO_2$. The emitted $CO_2$ can attract insects sensitive to such emissions, including mosquitoes. As the insect is drawn towards the emission, it is captured by the air flow, and trapped by an integral mesh filter 95, in FIG. 12.

FIG. 12 is a cross section view of a duct and fan assembly 90. An arrow is used to indicate the direction that air flows through the duct and fan assembly. A mesh filter 95 is positioned to filter the air flow and collect debris, including insects.

Figure 13:
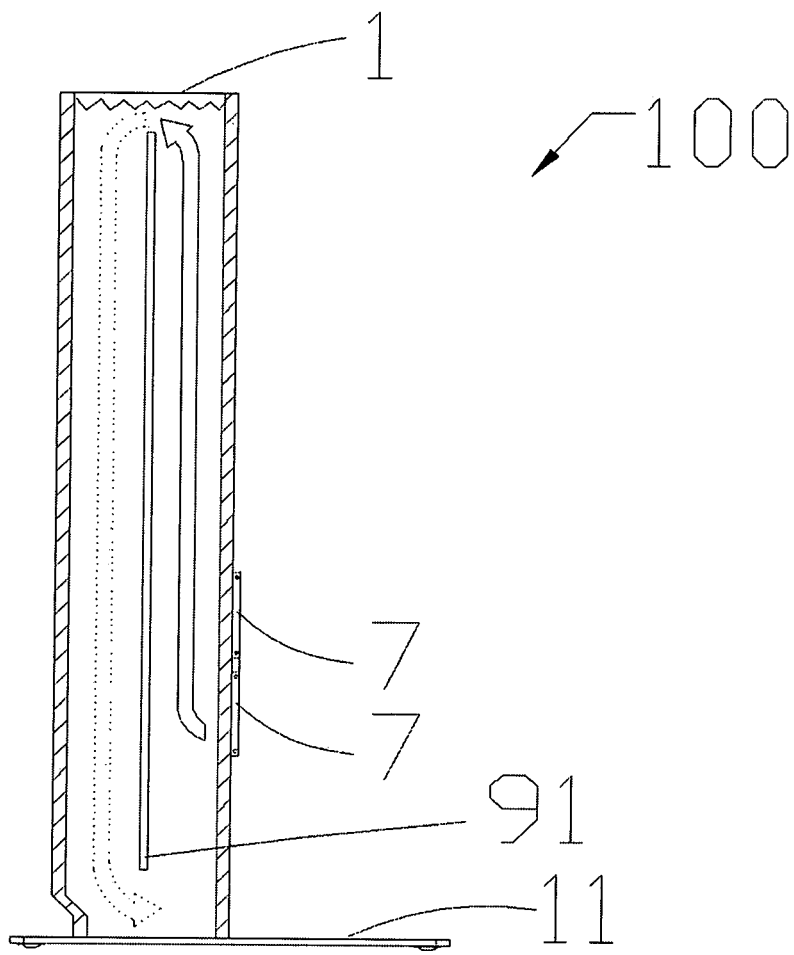
FIG. 13 is a sketch showing the use of an internal partition to improve natural convection.

FIG. 13 is a sketch of an embodiment using a partition 91 internal to the heat exchanger vessel 1 and immersed in the liquid coolant. The partition constrains the vertical flow of warm liquid (solid arrow) on the right, and cooler liquid (dashed arrow) on the left to more efficiently remove heat from the cold side of the modules 7.

The examples and embodiments that are described are intended to illustrate potential and specific implementations of the instrument and methods using the instrument. These examples are intended primarily for purposes of illustration. To those skilled in the art, it is clear that there may be variations to these examples without departing from the spirit of the disclosure. The intent is to claim the broadest allowable description of the disclosed innovation.

Figure 14:
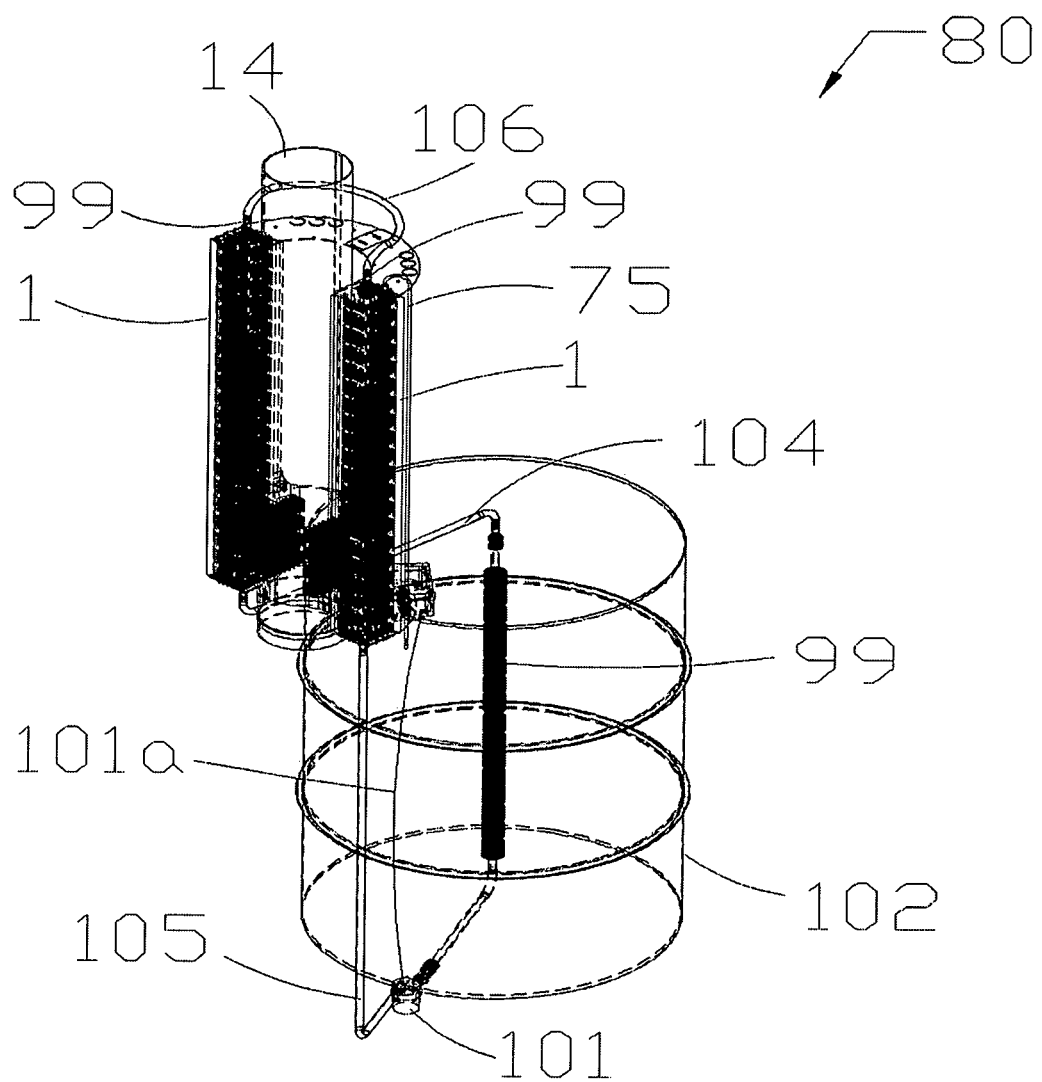
FIG. 14 is an isometric view of an assembled thermoelectric power generator system in conjunction with an external cooling reservoir.

FIG. 14 is an illustration of a thermoelectric power generator system 80 operating with a cooling reservoir 102 of variable size and capacity, coupled to a connection with the heat exchanger tubes 99 which function as the primary heat exchanger. Cooling reservoir 102 functions as a secondary heat exchanger and is fitted with an additional finned heat exchanger tube 99 located inside the reservoir 102 which contains a quantity of liquid coolant, which can include water. This secondary reservoir 102 would generally only be implemented in situations where the ambient temperature surrounding each vessel 1 is higher than desired, and convection air flows around each vessel 1 are not sufficient to discourage parasitic losses. This is a closed loop, tube-in-tube isolated primary-secondary heat exchanger process. This configuration maximizes the power output from the generator by improving the efficiency of the cooling loop by incorporating a small water pump 101 to cycle secondary liquid coolant through the reservoir 102 from the primary heat exchanger tubes 99 in each vessel 1. Thus the heated coolant in the vessels 1 is moved to the reservoir 102 through each heat exchanger tube 99, whereby the excess heat is dissipated and is returned back to the primary heat exchanger vessels 1. The control system for the pump 102 is duty cycle modulated by the system controller 74 which is responsive to the temperature of the liquid coolant inside the vessel 1. Thermistor sensor 75 provides an output proportional to the temperature of the coolant in the primary vessel 1 which allows controller 74 to determine the optimum cycle time to engage pump 101 on and off to maintain the desired coolant temperature in the vessel 1. Each primary heat exchanger tube 99 is coupled in a serial-cascade connection externally with a flexible tubing loop 106 to maintain nominally the same coolant temperature in both vessels 1 simultaneously. The liquid loop connections to the reservoir 102 are facilitated using extension tube 104 for the upper intake coupling and extension tube 105 for the lower return coupling. The energizing power for the pump 101 is directed through external control wire assembly 101a. The assembled power generator is coupled to the flue pipe 14, which is connected to a combustion site including a wood stove which is not shown.

What is claimed is:

1. A system to generate usable voltage comprising:
   at least one heat exchanger vessel having a first end and a second end, an interior surface with a set of interior fins, an exterior surface with a set of exterior fins, and an exterior first planar module surface, a liquid coolant retained by said heat exchanger vessel;
   at least one thermoelectric module having a designated hot side and a cold side, a heat source comprising a heated fluid;
   at least one heat absorber having a second planar module surface and at least one surface with heat absorber fins, a control module;
   wherein said heat absorber fins are immersed in said heated fluid and conduct heat from said heated fluid to the second planar module surface;
   the hot side of the at least one thermoelectric module is thermally connected to the second planar module surface;
   the cold side of the at least one thermoelectric module is thermally connected to the first planar module surface;
   the first planar module surface conducts heat from said cold side to said heat exchanger vessel;
   the heat exchanger vessel dissipates said heat from cold side to said liquid coolant via said interior fins and further to the ambient air via said exterior fins
   in this way, the heat exchanger vessel acts to maintain said cold side at a temperature lower than said hot side thereby maintaining a temperature differential;
   the at least one thermoelectric module produces a voltage while the temperature differential is maintained
   the said voltage is available to at least one external device via the control module.

2. The system of claim 1 wherein said heat exchanger vessel is an elongated tube oriented vertically with its long dimension substantially parallel to the force of gravity and such that said first end is above said second end;
   the at least one thermoelectric module is positioned on the first planar module surface and adjacent to said second end such that heat conducted to said liquid coolant warms the coolant and produces natural convection in said liquid coolant;
   the natural convection creates a flow of warmer liquid coolant toward said first end and cooler liquid coolant returns to said second end.

3. The system of claim 2 further comprising a valve to remove liquid wherein said valve is positioned on an external surface of said heat exchanger vessel such that a portion of said liquid coolant can flow out of said vessel when said valve is opened.

4. The system of claim 2 further comprising a condenser tube connected to said first end of heat exchanger vessel such that liquid coolant that is converted to a vapor phase by heat from said cold side condenses to a liquid phase on the internal surface of said condenser tube and returns to the liquid coolant in the heat exchanger vessel by gravity flow.

5. The system of claim 1 further comprising a fan powered by said at least one thermoelectric modules and positioned to produce forced convective cooling of said external fins of heat exchanger vessel.

6. The system of claim 1 further comprising a plurality of heat absorbers wherein the heat absorber fins of each of the plurality of heat absorbers are immersed in said heated fluid.

7. The system of claim 1 including a heat shield surrounding said heat absorber and said heat source.

8. The system of claim 2 wherein said heat exchanger vessel has a minimum liquid coolant retaining volume of 400 millimeters by 60 millimeters by 65 millimeters having said first and second ends suitably sealed such that said liquid coolant is retained without loss of coolant under operating conditions.

\* \* \* \* \*